INVENTOR
ROBERT W. BIERIG
BY Edgar O. Rost
ATTORNEY

INVENTOR
ROBERT W. BIERIG
BY Edgar O. Rost
ATTORNEY

INVENTOR
ROBERT W. BIERIG
BY Edgar O. Rost
ATTORNEY 3,444,484

SOLID STATE DELAY LINE FOR PROPAGATION OF MICROWAVE FREQUENCY ENERGY IN SPIN WAVE MODE

Robert W. Bierig, Sudbury, Mass., assignor to Raytheon Company, Lexington, Mass., a corporation of Delaware Filed Apr. 3, 1967, Ser. No. 627,951
Int. Cl. H03h 9/00, 9/30, 5/00
U.S. Cl. 333—30 9 Claims

ABSTRACT OF THE DISCLOSURE

A time delay device for propagation of electromagnetic wave energy in the spin wave mode in a body of a single crystal gyromagnetic material utilizing a uniform external DC biasing magnetic field applied parallel to the longitudinal axis of the body. Surrounding the gyromagnetic body is a polycrystalline sleeve member of a magnetic material having a higher saturation magnetization value than the body. Immersion of the composite structure in an externally applied biasing magnetic field of appropriate magnitude will result in the shaping of the inhomogeneous internal magnetic field in a predetermined manner. The device is rendered in two distinct regions of delay time dispersion. Over a portion of the frequency range the device is substantially nondispersive and there will be no change of delay time with a change of the frequency of the propagated energy. Over another region of the frequency range the device may be referred to as being linearly dispersive in that the slope of delay time curve increases linearly with incremental changes in frequency.

*Background of the invention*

The present invention relates primarily to microwave time delay devices and in particular to electronically adjustably delay lines. Certain solid state materials exhibit a gyromagnetic resonance characteristic. Under the influence of a saturating external DC magnetizing field together with a variable excitation field provided by the electromagnetic energy such materials produce moving magnetic disturbances referred to as spin waves, as well as hybrids of spin and acoustic waves referred to as magnetoelastic waves. For the purposes of the present application, therefore, the term "gyromagnetic" shall be interpreted to mean any ferro or ferrimagnetic materials which exhibit magnetic resonant oscillations in the presence of uniform DC biasing and microwave energy excitation magnetic fields. It is well known in the art that the cyclical variation of the phase velocities of a number of precessing electron spin wave packets give rise to the so-called spin wave modes having varying wavelengths. The interest in the present application is directed primarily to the shorter wavelength spin waves which may be propagated slowly through the gyromagnetic material sample and produce a predetermined delay time of the propagating electromagnetic energy. United States Letters Patent No. 3,244,993 issued to Ernst F. R. A. Schloemann, on Apr. 5, 1966, and assigned to the assignee of the present invention, incorporates an excellent summary of the various procedures for the excitation of the spin and magnetoelastic waves in the applicable solid state materials utilizing an "axially applied" magnetic field or "transversely applied" biasing magnetic field. In the operation of microwave time delay devices utilizing spin wave excitations it is important to bear in mind that the quantum of such excitations is referred to as the "magnon" which has a dynamic mass of five to one hundred times greater than that of an electron mass. Further, the magnon has no electric charge but does carry a magnetic moment directed opposite to the over-all saturation magnetization of the material. Adjustment of the spin wave propagation in the gyromagnetic material by varying the biasing field yields an efficient device for achieving any desired time delays in microwave energy transmission. The time delay is a related function of the length of the gyromagnetic material sample as well as the group velocity of the spin waves produced therein. Since a representative group velocity is in the order of $10^4$ centimeter/second this results in a time delay of one hundred microseconds in a sample having a length of one centimeter. Adjustment of the externally applied biasing magnetic field moves what may be referred to as the crossover point for spin wave generation within the sample and regulates the delay time.

It has been empirically noted that the nonlinearity of the applicable material which makes it attractive for amplification of waves moving therethrough gives rise to insertion loss value parameters which may become intolerable to the systems designer. The high insertion loss is particularly noted in axially magnetized samples of gyromagnetic material disposed in a uniform magnetic field and is primarily a result of the so-called demagnetizing fields which are the subject of an interesting paper entitled "Spin Wave Spectroscopy" by Ernst Schloemann, and published in the "Advances In Quantum Electronics," edited by Singer, Columbia University Press, New York, 1961, pp. 437–452. This article teaches us that with a body of gyromagnetic material placed in a substantially uniform axially applied magnetic field, the demagnetizing field lines of the internal magnetic field at the ends of the body are stronger and hence the net internal field is weaker at the end faces. In this configuration the spin waves generated in the interior of the sample are reflected to the nearest end face and then are propagated through the body as an acoustic shear wave which will again be reflected at the opposite end face before it is available for utilization. The propagating acoustic wave will have undergone four traversals of the so-called crossover region in traversing the length of a delay line element.

In the case of the transversely magnetized gyromagnetic material sample the internal demagnetizing field strength is entirely different with the net inhomogeneous field being substantially trough-shaped which results in straight-through transmission without the generated waves having to be first reflected at the nearest end face. In this configuration the demagnetizing field lines are weaker at the end faces. Hence, the field strength becomes stronger at the end faces and weaker in the middle region of the body. The spin wave packets therefore will propagate within the trough-shaped field in a manner analogous to pebbles rolling within a similar trough configuration.

Classical theoretical considerations, therefore, indicate that the shaping of the inhomogeneous internal magnetic field in the magnetized gyromagnetic material samples has a direct bearing and relationship to the insertion loss parameters as well as the delay times in microwave frequency transmission.

*Summary of the invention*

In accordance with the teachings of the present disclosure a microwave time delay device is provided having the internal inhomogeneous field shaped in a predetermined manner. Having established that the trough-shaped internal magnetic field offers the greatest advantages in transmission of microwave signals the provision of such a field has been accomplished in an axially magnetized rod of a gyromagnetic material, such as yttrium iron garnet, by sleeving such material in a member of a magnetic material having a higher saturation magnetization ($4\pi M_S$) parameter than the gyromagnetic material. With the trough-shaped internal inhomogeneous magnetic field the spin wave packets generated at one end face will be transmitted completely through the length of the sample without the necessity of reflection at the end faces. The gyromagnetic material which is preferably of a single crystal composition is provided with optically polished end faces and is disposed axially within a polycrystalline sleeve member of a magnetic material such as nickel aluminum ferrite. The observed delay times have been noted to be nondispersive over the initial frequency range and then exhibit a linearly dispersive quality at the upper end of the frequency range in accordance with the strength of the applied magnetic field and frequency of propagated energy. Such a variation provides a novel means for the realization in a single microwave delay line device of a means for providing two possible types of time delay dispersion over a broader frequency range than has been heretofore possible with known magnetoelastic solid state delay line structures.

*Brief description of the drawings*

The invention as well as the details of the construction of a preferred embodiment will be readily understood after consideration of the following detailed specification and reference to the accompanying drawings, in which.

*Description of the preferred embodiment*

Figure 1:
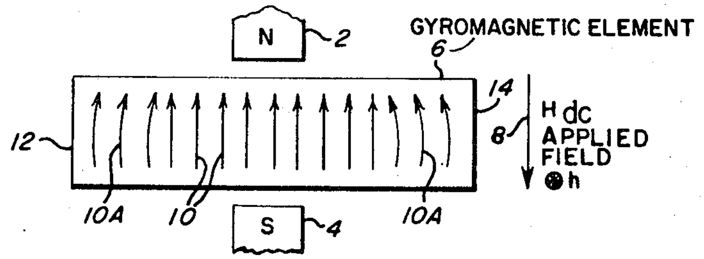
FIG. 1 is an explanatory schematic drawing of the demagnetizing field distribution within a transversely magnetized body of gyromagnetic material.
Figure 2:
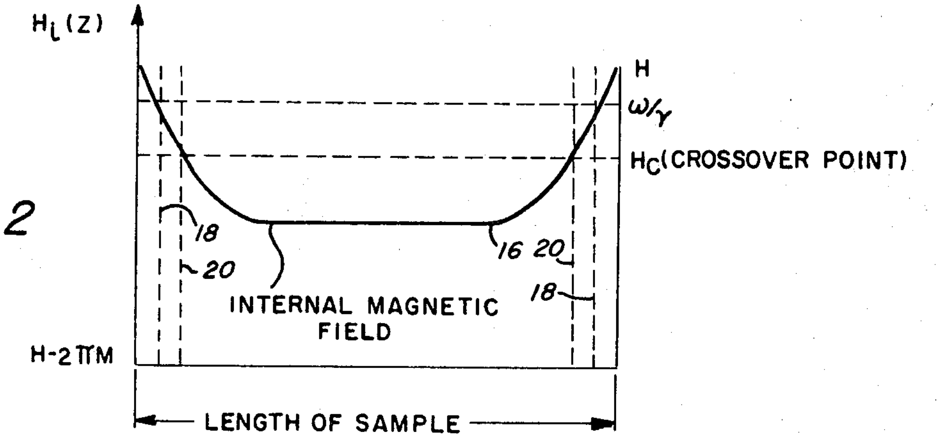
FIG. 2 is illustrative of the inhomogeneous internal magnetic field configuration in the sample externally magnetized as shown in FIG. 1.

Referring now to FIGS. 1 and 2, a brief explanation of the spin and magnetoelastic wave generation in the transversely magnetized field configuration will be discussed. The external transverse biasing magnetic field has been indicated by the polar designations N and S and the pole pieces 2 and 4. The sample of the gyromagnetic material is designated generally by the numeral 6 and arrow 8 indicates the direction of the biasing field together with the symbol $H_{dc}$. The circle and the cross together with the small letter *h* indicates the orthogonal exciting magnetic field of the electromagnetic wave energy having a component substantially perpendicular to the applied biasing field. In the classical analysis of the exchange forces within the solid state material in relation to the dipole moments it is considered that if the electromagnetic energy frequency is equal to the natural precession frequency of the electron spins within the material, energy will couple into the spin system. The precession amplitude will grow and energy will be absorbed from the magnetic field. The frequency at which this coupling is most efficient is the so-called gyromagnetic resonant frequency and may be varied by changing the strength of the applied biasing magnetic field. In a non-ellipsoidal body of a gyromagnetic material the demagnetizing lines are indicated by the solid line arrows and the numerals 10. It is noted that at the end portions of the body adjacent end faces 12 and 14 the demagnetizing field lines bulge noticeably as indicated by the arrows 10A and therefore the net internal field which is the difference between the biasing and demagnetizing fields is stronger adjacent to the end faces of the sample. The internal inhomogeneous magnetic field in the center of the body where the biasing and demagnetizing lines are substantially equal will therefore be weaker than at the end faces.

As shown in FIG. 2, the configuration of the internal magnetic field may be represented as a trough indicated by the curve 16. Adjacent to the respective end faces a turning point indicated by the dotted line 18 will exist where the elastic vibrations of phonons reach the spin wave mode of propagation and the symbol $\omega/\gamma$ indicates this condition where the symbol for $\omega$ is the angular frequency of the spin waves and $\gamma$ is the gyromagnetic ratio. The exponential character of the inhomogeneous internal magnetic field is clearly shown and with this trough shape the spin wave to elastic wave conversion picks up momentum at the crossover point $H_c$. The spin wave packets, therefore, travel through the body to the crossover point adjacent to the other end of the sample. Numerous reflections may take place with the packets rolling back and forth until reconversion back into electromagnetic energy occurs at the opposing end face of the sample. The internal magnetic field configuration indicated herein results in a condition which is similar to a group of pebbles rolling in a trough to and fro continually interacting and exchanging energy with one another to achieve the level of excitation needed for continuous action. The letter H indicates the applied magnetic biasing field and adjustment of the magnitude of this field will move the points at which the elastic and spin waves cross over within the sample.

Figure 3:
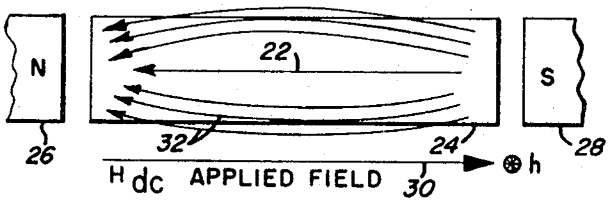
FIG. 3 is an explanatory diagram of the demagnetizing field line distribution in an axially magnetized sample of gyromagnetic material.
Figure 4:
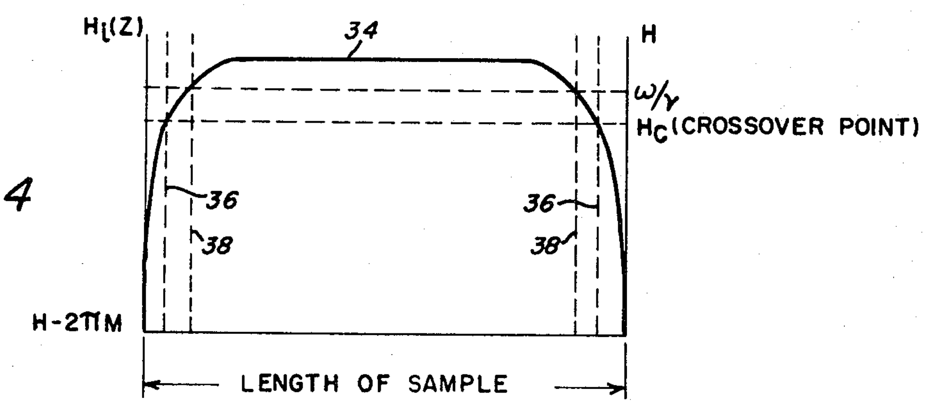
FIG. 4 is illustrative of the inhomogeneous internal magnetic field distribution within the sample associated with FIG. 3.

Referring now to FIGS. 3 and 4, an alternative disposition of the DC magnetic biasing field is shown as being directed axially or parallel to the longitudinal axis 22 of body 24 of the gyromagnetic material disposed between pole pieces 26 and 28. As in the previous illustration, the symbol $H_{dc}$ together with arrow 30 indicates the direction of the magnetic biasing field. The demagnetizing field lines which extend in the opposite direction are indicated by the arrows 32. It will now be noted in this configuration that the demagnetizing field lines at the ends of the rods are stronger and hence the net internal magnetic field will be weaker at the end faces and stronger in the middle of the samples. The inhomogeneous internal magnetic field configuration will therefore resemble an inverted trough as indicated by the curve 34. As the spin wave crossover point indicated by the dotted line 36 is reached the spin wave packets travel to the nearest end face where they are reflected and returned to the magnetoelastic crossover point by the polished end face. In the center of the sample length no spin wave modes exist and the only means for propagation of the energy from one end face to the opposite end face is by the conversion of the magnetoelastic waves into elastic shear waves at acoustic wavelengths. The turning point where the $\omega/\gamma$ condition exists is indicated by the dotted line 38. In the working embodiments of the spin wave type of microwave delay lines it has been determined that the axially applied biasing magnetic field configuration is preferred. The disadvantages, however, of the high insertion losses due to the numerous reflections at the end faces and the necessity for the propagation in the central part of the body at the acoustical wavelengths have left much to be desired in solid state delay lines.

Figure 5:
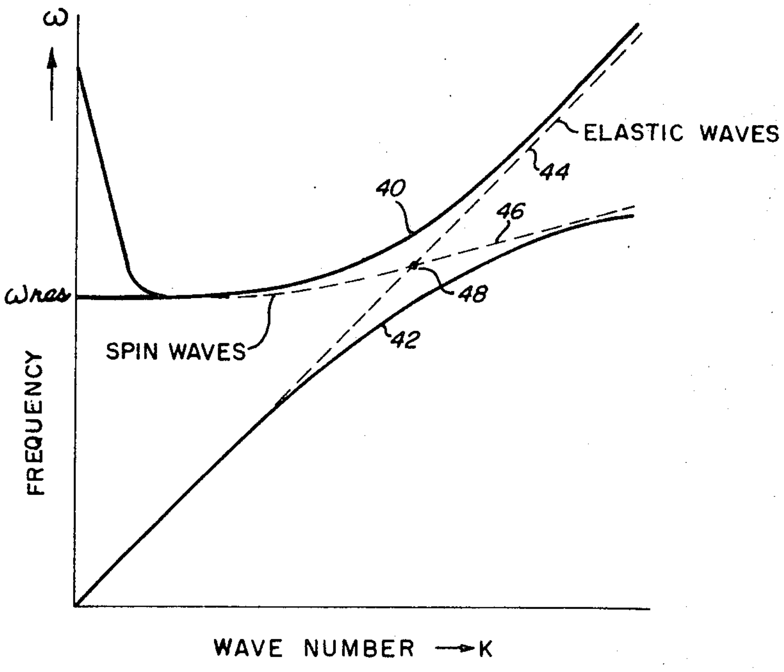
FIG. 5 is a dispersion diagram for spin and elastic waves within a solid state material and the exchange interaction effects which result in spin and magnetoelastic wave propagation.

Referring next to FIG. 5, there is illustrated a dispersion diagram plotting $\omega$ versus $k$ for the spin waves and elastic waves of interest. The solid curves 40 and 42 indicate the upper and lower magnetoelastic dispersion curves which represent a hybrid of the spin and elastic waves.

The dotted lines 44 and 46 indicate the dispersion relations for spin waves and elastic waves individually in infinitely large samples of, for example, yttrium iron garnet. The wave number indicated by the letter $k$ is equal to $2\pi$/wavelength. It is noted that elastic waves plotted along the line 44 move through the gyromagnetic material at speeds which are plotted as a straight line as indicated. The spin waves have been plotted and it is noted that the propagation velocity increases with the shorter spin wave wavelengths. The elastic and spin waves have a crossover point indicated at 48 where there is a strong interaction between the two types of waves. The result is a mixed mode of propagation which is referred to as the magnetoelastic wave. For a given resonant frequency indicated by the symbol $\omega_{res}$ the phase constants of the spin waves and the elastic waves may be matched. The internal DC magnetizing field strength will determine the spin wave phase velocities for given frequencies and the direction of transfer of energy from spin waves to elastic waves and vice versa. As the magnetizing field strength is increased the spin wave phase velocities tend to increase and energy is more readily transferred from the elastic waves to the spin waves. It is now known from the above referenced article that wave packets of spin waves move in the internal magnetic field inside a gyromagnetic material in much the same manner as the particles in a field having a voltage potential. The internal magnetic field is equivalent to the potential energy of a particle. It is therefore of the utmost importance in the control of the propagating characteristics of the electromagnetic energy through the solid state delay line to control shaping of the inhomogeneous internal magnetic field to provide for the most efficient configuration consonant with the desired parameters of a microwave delay line.

Figure 6:
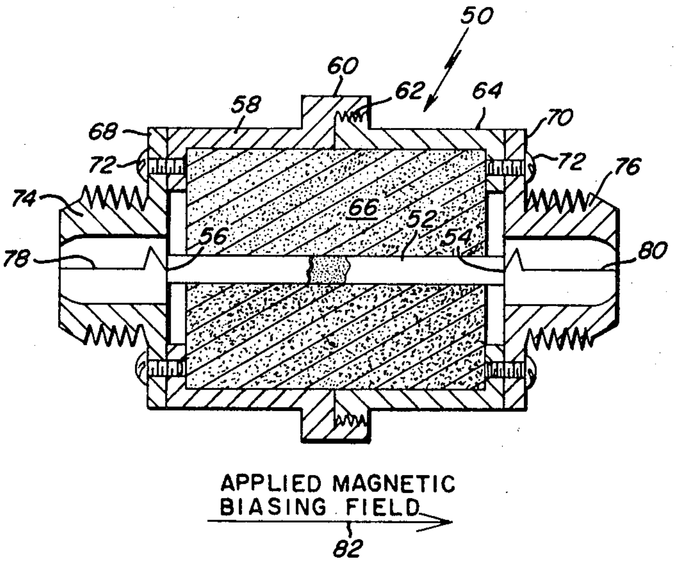
FIG. 6 is a cross-sectional view of an illustrative embodiment of the present invention.

Referring next to FIG. 6, the illustrative embodiment of the invention is designated 50. A substantially cylindrical delay line element such as a single crystal rod 52 of yttrium iron garnet is provided with optically polished end faces 54 and 56. A coaxial housing member 58 with a flange portion 60 having a re-entrant internally threaded wall 62 surrounds a portion of the composite structure of the delay line element. A mating housing member 64 threadably engages flange 60 to complete the outer body member. The cylindrical YIG rod member 52 in accordance with the practice of the invention is sleeved by means of a magnetic member 66 concentrically disposed and surrounding the rod member. In a preferred embodiment the sleeve member 66 was fabricated by ultrasonically cutting said member from a polycrystalline nickel aluminum ferrite material. The "shaping" of the internal inhomogeneous magnetic field is achieved by means of the magnetic sleeving material having a higher saturation magnetization characteristic than the rod member 52. End cover members 68 and 70 are secured to the housing members 58 and 64 by means of screws 72. Input and output electromagnetic energy coaxial coupling members 74 and 76 are provided with wire antennae members 78 and 80 which are disposed in contact with the end faces 56 and 54 of the rod 52.

To avoid the penetration by electromagnetic energy into the sleeve member 66 the external surfaces may be gold plated.

The entire composite assembly is immersed in an axially applied magnetic field directed in accordance with the teachings of the invention and indicated by the arrow 82. For an illustrative operating frequency of 1.3 gHz., a calculated magnetization value of the VIG rod of 140 oersteds and a sleeve magnetization value of 200 oersteds, the applied biasing magnetic field required will be of the order of 1 kilo-oersted.

Figure 7:
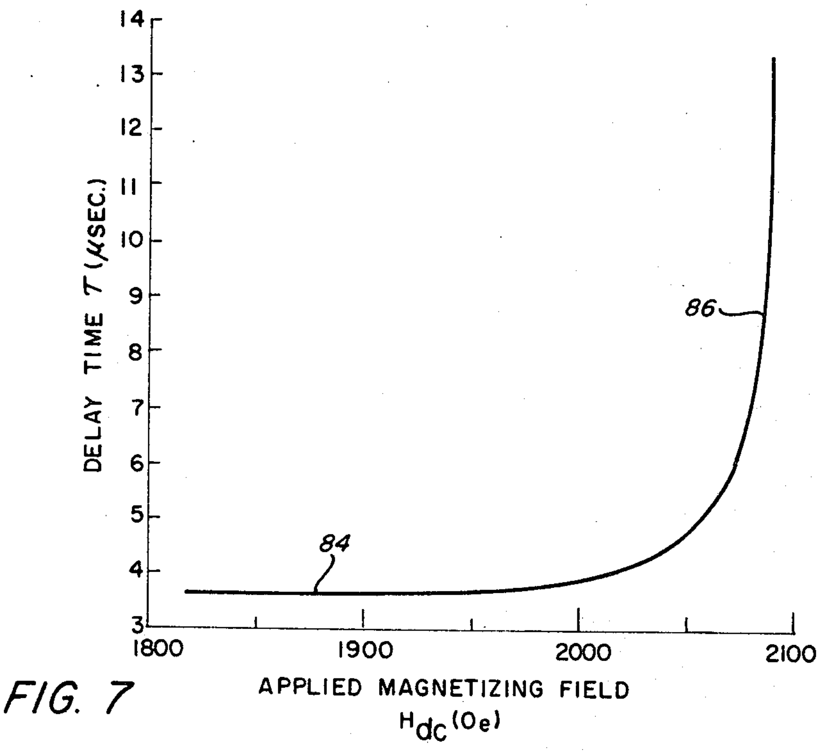
FIG. 7 is a diagram illustrating the variation of the transit delay time of microwave energy signal pulses measured in relation to the applied external magnetic field in an illustrative embodiment of the present invention.

Referring now to FIG. 7, a representative calculated delay time value related to the applied magnetic field is shown for the "transmission" mode of propagation of an illustrative embodiment of the invention. It may be noted that the variation of delay time is now rather different than what might be expected from a knowledge of prior art magnetoelastic delay lines. In the general region of the curve indicated by the numeral 84 over the range of approximately 1800 to 1950 oersteds the delay time is essentially nondispersive. The delay time then appears to remain constant with variations in the applied biasing magnetic field utilizing the composite sleeved yttrium iron garnet rod delay line. At somewhat higher magnetic fields, however, a new phenomenon is observed in that increasing of the magnetic field in incremental steps results in the delay time varying linearly. The delay line may therefore be referred to as being dispersive in this region which is generally indicated by the numeral 86 on the curve shown in FIG. 7. The utility of the dispersive as well as nondispersive qualities of the composite delay line will therefore be evident and over the calculated region of the substantially constant delay time a fixed magnetic field may be applied while in the dispersive region small increments or variations in the applied magnetic field will provide a predetermined linearly varying delay time.

Figure 8:
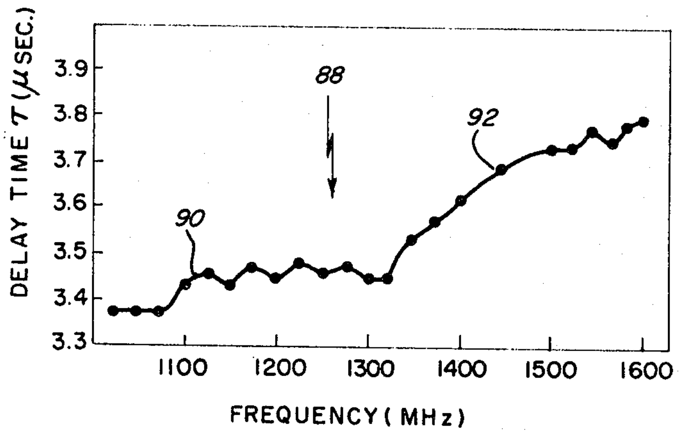
FIG. 8 is a diagram illustrating the time delay dispersion characteristics related to the frequency of the propagating energy.

In FIG. 8 some typical experimental data has been plotted of time delay dispersion related to the frequency $\omega$ with the gyromagnetic rod axis being disposed parallel to the applied biasing magnetic field. It is preferred that the gyromagnetic material be cut from a single crystal material in such a way that the crystallographic direction is aligned with the axis of the rod and the DC biasing magnetic field. In the illustrative embodiment, the (111) crystallographic direction coincides with the direction of propagation of the energy. The ratio of the sleeve diameter to the diameter of the gyromagnetic rod is approximately 6 while the ratio of the saturation magnetization value of the outer sleeve in relation to the gyromagnetic rod is approximately 1.8. The applied biasing magnetic field had a fixed value of approximately 1275 gauss. The electromagnetic energy in the frequency range of below 1100 to 1350 mHz. indicated by the numeral 90 on curve 88 provides further evidence of the nondispersive characteristics of the composite delay line structure. At the higher frequencies indicated by the numeral 92 on curve 88 the linearly dispersive region is quite evident. Smaller variations in frequency resulted in the linear changes in the slope of the delay time value ($\tau$). This characteristic is exceedingly valuable in pulse compression techniques for radar signal processing. The insertion loss values for the embodiments evaluated were approximately 10 db lower than prior art delay line structures without the sleeved configuration.

Figure 9:
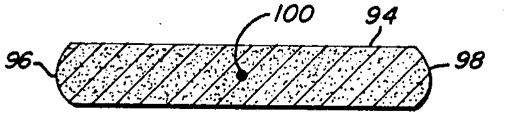
FIG. 9 is a cross-sectional view of an alternative embodiment of the solid state delay line element.

A modification of the present invention is illustrated in FIG. 9 wherein the plane end faces of the single crystal gyromagnetic material are cut in another configuration. Confocal surfaces 96 and 98 are provided at the ends of rod member 94. The term "confocal" is interpreted to mean that the surfaces have the same foci which is indicated in the illustration by the numeral 100. With the described modification improved coupling of the electromagnetic energy to the solid state rod is believed to contribute to the improved results obtained in the measurement of delay times.

There is thus disclosed in the present invention a unique means for the shaping of inhomogeneous internal magnetic fields within gyromagnetic bodies to thereby provide in an axially applied external biasing magnetic field the desirable characteristics previously attainable only in a transversely applied biasing magnetic field. In the solid state delay line art the axially applied biasing magnetic field is preferred since the spin wave mode of excitation is more readily achieved in this magnetic field orientation. In the previously described transversely applied biasing magnetic field the spin waves are 90° out of phase with the exciting magnetic field and hence it is more difficult to raise the phonons to the prerequisite velocity of the magnons to generate the spin wave packets which provide the means for the transmission of energy through the solid state sample. In the transversely applied field the velocity of the spin waves is appreciably slower and hence the insertion loss characteristics become exceedingly high and intolerable in radar signal processing. With the axially applied biasing magnetic field a somewhat lower value of the magnetic field is predicted which is a factor worthy of consideration in the reduction of the magnetic weight and accompanying costs. The main feature of the invention to consider with regard to the sleeved configuration is that such material have a higher saturation magnetization value that the delay line element. Various empirical results have indicated that the overall length of the sleeving member need not be the same as the solid state delay line element and the ratio of sleeve radius to rod radius may have a value of 2 or larger. The dispersive and nondispersive characteristics also provide a new and useful tool to the radar systems designer to provide controllable and reproducible delay times in radar signal processing.

It will be obvious to those skilled in the art that numerous modifications and alterations may be practiced.

What is claimed is:

1. In combination:
- a body of gyromagnetic material having a longitudinal axis;
- means for applying an external DC biasing magnetic field parallel to the axis of said body to produce an inhomogeneous internal magnetic field;
- and means for shaping said inhomogeneous magnetic field to provide a net internal field which is stronger adjacent to the end faces and weaker in the middle region of said body;
- said means comprising a sleeving member of a magnetic material having a higher saturation magnetization value than said gyromagnetic body surrounding said gyromagnetic body.

2. In combination:
- a body of a gyromagnetic material having a longitudinal axis;
- means including a member of a magnetic material surrounding said gyromagnetic body;
- means for applying a uniform external DC biasing magnetic field to the composite structure in a direction parallel to the longitudinal axis of said body to produce an inhomogeneous internal magnetic field therein;
- means for applying an exciting magnetic field of an input microwave frequency electromagnetic wave energy signal to one end face of said body;
- said biasing and exciting magnetic fields having a predetermined magnitude sufficient to initiate and sustain magnetic resonant oscillations in the spin wave mode of propagation;
- said spin wave oscillations being transmitted directly through said body in the transmission mode of propagation to the opposing end face of said body;
- and output microwave frequency electromagnetic energy signal means coupled to said opposing end face of said body.

3. The combination according to claim 2 wherein said internal inhomogeneous magnetic field is substantially trough-shaped with the net field being stronger at the ends and weaker in the middle region of said body.

4. In combination:
- a cylindrical body member of a gyromagnetic material having a longitudinal axis and opposing end faces;
- means including a member of a magnetic material surrounding said gyromagnetic body;
- said magnetic member having a dimension transverse to the longitudinal axis of said gyromagnetic body which is substantially larger than the diameter of said body;
- means for applying an external DC biasing magnetic field to the combined gyromagnetic and magnetic members in a direction parallel to the longitudinal axis of said body to produce an inhomogeneous internal magnetic field therein;

- means for applying input microwave frequency electromagnetic wave energy signals to one end face;
- and means for coupling output microwave frequency electromagnetic wave energy signals from the opposing end face.

5. A solid state microwave frequency time delay device comprising:
- a delay line element of a gyromagnetic material having a longitudinal axis and plane end faces;
- a sleeve member of a magnetic material having a higher saturation value than said gyromagnetic material surrounding said element;
- means for applying an external DC biasing magnetic field to the combined sleeve member and element in a direction parallel to the longitudinal axis of said element;
- means for coupling an electromagnetic wave energy signal having an exciting magnetic field to one end face of said element;
- said biasing and exciting magnetic fields having a predetermined magnitude to initiate and sustain spin wave modes of propagation within said element;
- and output microwave frequency electromagnetic energy signal means coupled to the other end face.

6. A solid state microwave frequency time delay device according to claim 5 wherein said delay line element comprises a rod of a single crystal yttrium iron garnet and said sleeve member comprises a polycrystalline cylinder of a ferrite material.

7. A solid state microwave frequency time delay device according to claim 5 wherein said delay line element end faces have a confocal configuration.

8. A solid state nondispersive microwave frequency time delay device comprising:
- a delay line element including a rod of a gyromagnetic material having opposing end faces;
- a sleeve member of a ferrite material having a higher saturation magnetization value than said delay line element concentrically disposed around said element;
- means for applying a uniform DC biasing magnetic field of fixed predetermined magnitude in a direction parallel to the longitudinal axis of said rod to produce therein a inhomogeneous internal magnetic field which is substantially trough-shaped;
- means for applying an input microwave frequency signal to one end face of said rod;
- means for effecting transmission of said signal through said rod in the spin wave mode of magnetic resonant oscillations with the length of time of propagation being substantially independent of the frequency of the input signal;
- and output microwave frequency electromagnetic energy signal means connected to the opposing end face of said rod.

9. A solid state dispersive microwave frequency time delay device comprising:
- a delay line element including a rod of a gyromagnetic material having opposing end faces;
- a sleeve member of a ferrite material having a higher saturation magnetization value than said delay line element concentrically disposed around said element;
- means for applying a uniform DC biasing magnetic field of fixed predetermined magnitude in a direction parallel to the longitudinal axis of said rod to produce therein an inhomogeneous internal magnetic field which is substantially trough-shaped;
- means for applying an input microwave frequency signal to one end face of said rod;
- means for varying the magnitude of said biasing magnetic field to effect transmission of said input signal through said rod in the spin wave mode of magnetic resonant oscillations with the length of time of propagation varying linearly with variation in the frequency of the input signal;

and output microwave frequency electromagnetic energy signal means connected to the opposing end face of said rod.

References Cited

UNITED STATES PATENTS 3,019,398 1/1962 Wellman ............ 333—31

3,244,993 4/1966 Schloemann .......... 330—4.8

HERMAN K. SAALBACH, *Primary Examiner.*

P. L. GENSLER, *Assistant Examiner.*

U.S. Cl. X.R.

333—24.1, 31